(12) United States Patent
Tada et al.

(10) Patent No.: US 6,744,839 B1
(45) Date of Patent: Jun. 1, 2004

(54) CLOCK REGENERATION CIRCUIT

(75) Inventors: Shunichi Tada, Tokyo (JP); Kenichi Shiraishi, Yokohama (JP)

(73) Assignee: Kabushiki Kaisha Kenwood, Tokyo (JP)

(*) Notice: Subject to any disclaimer, the term of this patent is extended or adjusted under 35 U.S.C. 154(b) by 0 days.

(21) Appl. No.: 09/423,667

(22) PCT Filed: Jun. 10, 1998

(86) PCT No.: PCT/JP98/02553

§ 371 (c)(1),
(2), (4) Date: Feb. 7, 2000

(87) PCT Pub. No.: WO98/57470

PCT Pub. Date: Dec. 17, 1998

(30) Foreign Application Priority Data

Jun. 13, 1997 (JP) ............................. 9-171184
Jul. 11, 1997 (JP) ............................. 9-201036

(51) Int. Cl.⁷ .................................................. H03D 3/24
(52) U.S. Cl. ...................................................... 375/376
(58) Field of Search ................................. 375/376, 320, 375/327; 387/37; 329/301, 325; 370/487; 327/146–151, 156–160

(56) References Cited

U.S. PATENT DOCUMENTS

| 3,773,979 A | * | 11/1973 | Kirk, Jr. et al. | ............ | 370/487 |
| 4,117,405 A | * | 9/1978 | Martinez | .................... | 455/502 |
| 4,272,788 A | * | 6/1981 | Ogita | .......................... | 348/729 |
| 4,472,685 A | * | 9/1984 | Dutasta | ....................... | 329/325 |
| 4,585,998 A | * | 4/1986 | Veillard | ....................... | 329/301 |
| 4,928,177 A | * | 5/1990 | Martinez | .................... | 725/121 |
| 5,124,861 A | * | 6/1992 | Shimotashiro et al. | ........ | 360/39 |
| 5,471,464 A | * | 11/1995 | Ikeda | ............................. | 370/19 |
| 5,787,135 A | * | 7/1998 | Clark | ........................... | 375/376 |
| 5,894,334 A | * | 4/1999 | Strolle et al. | ................ | 348/725 |
| 6,006,078 A | * | 12/1999 | Yamamoto et al. | ......... | 455/264 |
| 6,118,499 A | * | 9/2000 | Fang | ........................... | 348/726 |

FOREIGN PATENT DOCUMENTS

| EP | 0538903 A1 | * 4/1993 | .............. H03I/7/18 |
| JP | 5-122063 | 5/1993 | |
| JP | 7-58636 | 3/1995 | |
| JP | 7-202965 | 8/1995 | |
| JP | 9-102775 | 4/1997 | |
| JP | 9-326836 | 12/1997 | |
| JP | 10-22956 | 1/1998 | |
| JP | 10-22974 | 1/1998 | |

* cited by examiner

*Primary Examiner*—Don N. Vo
(74) *Attorney, Agent, or Firm*—Robinson Intellectual Property Law Office, P.C.

(57) ABSTRACT

A clock regeneration circuit for regenerating a clock signal for demodulating data from an AM data multiplex modulated signal where digitally modulated signals are multiplexed in the same frequency band as those of an amplitude-modulated signal at the same time. The carrier for an amplitude-modulated signal is extracted from an AM data multiplex modulated signal where digitally modulated signals are multiplexed in the same frequency band as those of the amplitude-modulated signal at the same time through a band-pass filter, and the oscillation frequency of a voltage-controlled oscillator is controlled by the output of a phase comparator through a loop filter. The oscillation output of the voltage-controlled oscillator is supplied to a direct digital synthesizer and the phase of the carrier extracted through the band-pass filter is compared with the phase of the output of the direct digital synthesizer using the phase comparator. The oscillation output of the voltage-controlled oscillator is then synchronized with the carrier for the amplitude-modulated signal to produce a clock signal for demodulating data.

5 Claims, 4 Drawing Sheets

CLOCK REGENERATION CIRCUIT

TECHNICAL FIELD

The present invention relates to a clock regeneration circuit for regenerating a clock signal for data demodulation from an AM data multiplex demodulated signal which is obtained by multiplexing a digital modulated signal and an AM modulated signal in the same frequency band and at the same time.

RELATED BACKGROUND ART

A conventional data multiplex method is roughly classified into a time division multiplex method used by character multiplex broadcasting of television broadcasting and a frequency multiplex method used by character multiplex broadcasting used by FM broadcasting. The frequency band occupied by AM broadcasting is narrow so that frequency multiplex and time division multiplex cannot be used. An AM data multiplex modulated signal generating apparatus for multiplexing an AM modulated signal and a digital modulated signal in the manner similar to data multiplex broadcasting in television or FM broadcasting, has not been realized as yet.

The applicant of the present application has proposed an apparatus for generating an AM data multiplex modulated signal to be obtained by multiplexing an AM modulated signal and a digital modulated signal, the apparatus not adversely affecting an AM synchronous detection output when the AM data multiplex modulated signal is AM-synchronously detected (JP-A-8-166636).

The specific contents of an AM data multiplex modulated signal modulated in the above manner will be later detailed. Since a digital modulated signal and an AM modulated signal are multiplexed in the same frequency band and at the same time, a modulating method is different from that used by time division multiplexing or frequency multiplexing. It is, therefore, impossible to reproduce a clock signal used for signal demodulation through synchronous detection, by extracting a desired digital modulated signal at a selected data multiplex time and frequency band as in conventional cases.

SUMMARY OF THE INVENTION

It is an object of the present invention to provide a clock regeneration circuit for regenerating a clock signal used for data demodulation from an AM data multiplex modulated signal obtained by multiplexing an AM modulated signal and a digital modulated signal in the same frequency band and at the same time.

According to one aspect of the present invention, a clock regeneration circuit for regenerating a clock signal for data demodulation from an AM data multiplex modulated signal obtained by multiplexing a digital modulated signal and an AM modulated signal in the same frequency band and at the same time, comprises carrier extracting means for extracting a carrier of the AM modulated signal from the AM data multiplex modulated signal, phase comparator means for receiving as one input the carrier extracted by the carrier extracting means, a voltage-controlled oscillator whose oscillation frequency is controlled by an output from the phase comparator means, and frequency-dividing means for frequency-dividing the oscillation frequency of the voltage-controlled oscillator and supplying a frequency-divided output to the phase comparator means as another input.

In the clock regeneration circuit of this invention, the carrier extracting means extracts the carrier of the AM modulated signal from the AM data multiplex modulated signal, the phases of the extracted carrier and an output of the frequency divider are compared by the phase comparator, and in accordance with a phase comparison result, the oscillation frequency of the voltage-controlled oscillator is controlled. Accordingly, the oscillation output of the voltage-controlled oscillator is synchronized with the carrier of the AM modulated signal, and the oscillation output of the voltage-controlled oscillator can be used as the clock signal for demodulating the digital modulated signal separated from the AM data multiplex modulated signal.

As the frequency divider, a direct digital synthesizer may be used which is input with an oscillation output from the voltage-controlled oscillator and supplies an output to the phase comparator as the other input.

According to another aspect of the invention, a clock regeneration circuit for regenerating a clock signal for data demodulation from an AM data multiplex modulated signal obtained by multiplexing a digital modulated signal and an AM modulated signal in the same frequency band and at the same time, comprises frequency-converting means for frequency-converting the AM data multiplex modulated signal into an intermediate frequency, carrier extracting means for extracting a carrier of the AM modulated signal from the AM data multiplex modulated signal frequency-converted into the intermediate frequency, phase comparator means for receiving as one input the carrier extracted by the carrier extracting means, a voltage-controlled oscillator whose oscillation frequency is controlled by an output from the phase comparator means, and a first direct digital synthesizer for inputting an oscillation output from the voltage-controlled oscillator and supplying an output to the phase comparator means as another input, and a second direct digital synthesizer for inputting the oscillation output from the voltage-controlled oscillator and supplying an output to the frequency-converting means as a local oscillation output, wherein the oscillation output of the voltage-controlled oscillator is used as a clock signal for data demodulation from the AM data multiplex modulated signal.

According to this clock regeneration circuit of this invention, the carrier extracting means extracts the carrier of the AM modulated signal from the frequency-converted AM data multiplex modulated signal, the phases of the extracted carrier and an output of the first direct digital synthesizer are compared by the phase comparator, and in accordance with a phase comparison result, the oscillation frequency of the voltage-controlled oscillator is controlled. The oscillation output of the voltage-controlled oscillator is supplied to the frequency-converting means as a local oscillation output. Accordingly, the oscillation output of the voltage-controlled oscillator is synchronized with the carrier of the AM modulated signal, and the oscillation output of the voltage-controlled oscillator can be used as the clock signal for demodulating the digital modulated signal separated from the AM data multiplex modulated signal.

EMBODIMENTS OF THE INVENTION

First Embodiment

Figure 1:
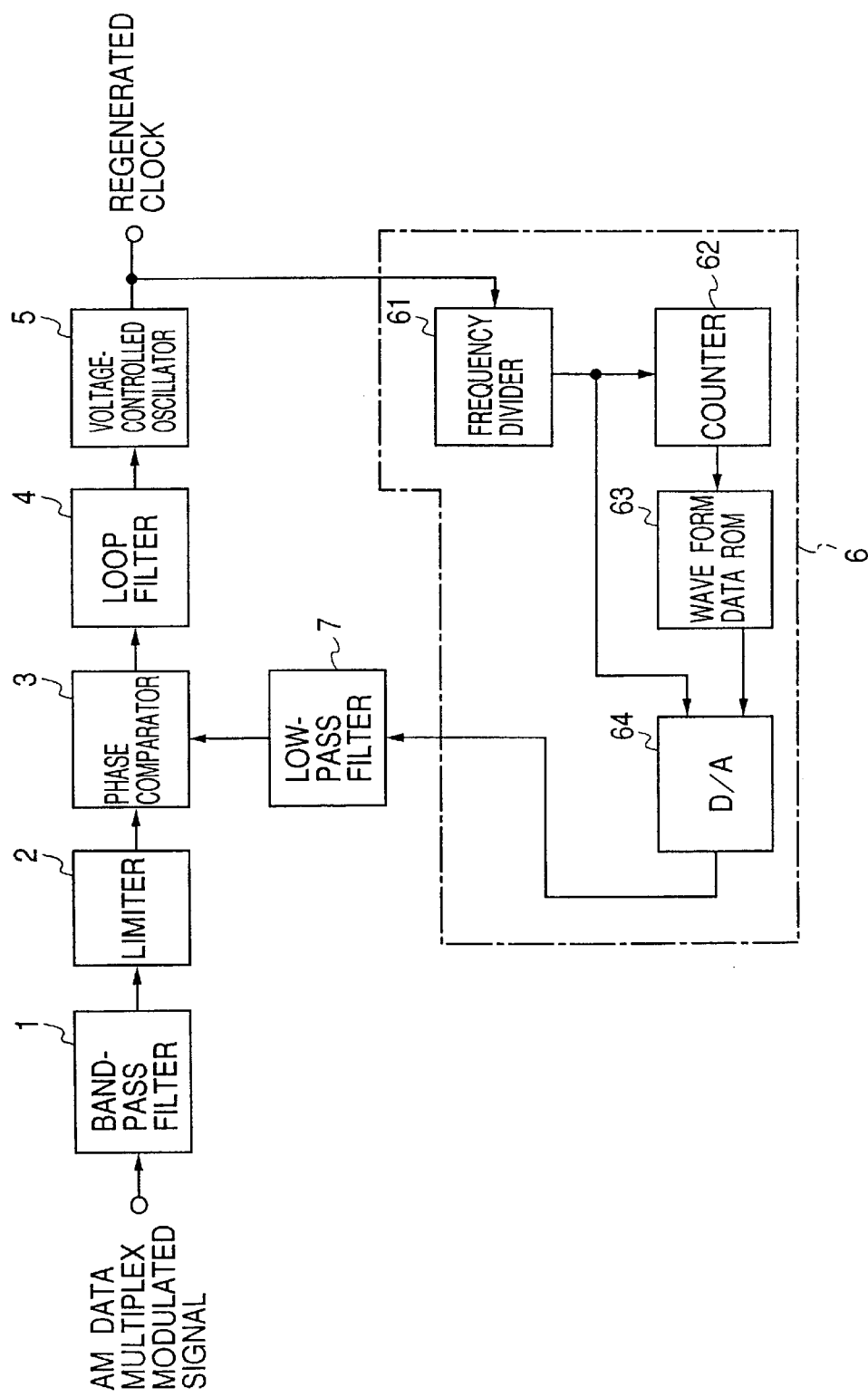
FIG. 1 is a block diagram showing the structure of a clock regeneration circuit according to an embodiment of the invention.

A clock regeneration circuit of this invention will be described with reference to preferred embodiments. FIG. 1 is a block diagram showing the structure of a clock regeneration circuit according to a first embodiment of the invention.

Prior to describing the clock regeneration circuit of the invention, an apparatus for generating an AM data multiplex modulated signal will be described with reference to FIG. 2.

In the AM data multiplex modulated signal generating apparatus, an analog signal (hereinafter simply called an input signal where applicable), such as a voice signal or the like is supplied to an AM modulator 11 in which the input signal is AM-modulated by a carrier having a frequency of fc generated by a frequency divider 122 to be later described. The AM modulator 11 is composed of an A/D converter 111 for A/D converting the input signal and a multiplier 112 for AM-modulating an output of the A/D converter 111.

The AM data multiplex modulated signal generating apparatus also includes a QPSK baseband signal generator 12 which is composed of: a master clock oscillator 121 for oscillating at a frequency of, e.g., 32 MHz; a frequency divider 122 for dividing an oscillation frequency of the master clock oscillator 121 to generate signals having frequencies of 2 MHz and 6 kHz; a direct digital synthesizer 123 for receiving a signal having a frequency of 2 MHz from the frequency divider 122 and generating the carrier having the frequency of fc, two orthogonal signals having a frequency of (fc+fα) and two orthogonal signals having a frequency of (fc−fα); and a serial/parallel converter 124 for converting serial digital data I and Q of 6 kbps into parallel digital data I and Q. The QPSK baseband digital signal generator 12 outputs QPSK baseband digital signals from the serial/parallel converter 124. An output signal having a frequency of 2 MHz is used as a clock signal for the A/D converter 111, an output signal having a frequency fc is supplied as a clock signal of the AM modulator 112, and an output signal having a frequency of 6 kHz is supplied as a conversion clock signal of the serial/parallel converter 124.

The QPSK baseband digital signals I and Q output from the QPSK baseband digital signal generator 12 are supplied to a quadrature modulator 13 composed of multipliers 131 and 132 and an adder 133. The multiplier 131 multiplies the I data by cos(ωc+ωα)t, the multiplier 132 multiplies the Q data by sin(ωc+ωα)t, and the adder 133 adds the outputs of the multipliers 131 and 132 to thereby quadrature-modulate the carrier having a frequency of (fc+fα) by the QPSK baseband digital signals. The frequencies (fc+fα) and (fc−fα) correspond to the frequencies of upper and lower AM modulated side bands.

The QPSK baseband digital signals I and Q output from the QPSK baseband digital signal generator 12 are also supplied to a complex conjugator 14 which generates a complex conjugate of sign inverted digital signals I and Q. The complex conjugator 14 may be composed of an inverter 141 for inverting the I signal.

The QPSK baseband digital signals I and Q output from the complex conjugator 14 are supplied to a quadrature modulator 16 composed of multiplies 161 and 162 and an adder 163. The multiplier 161 multiplies the I data by cos(ωc−ωα)t, the multiplier 162 multiplies the Q data by sin(ωc−ωα)t, and the adder 163 adds the outputs of the multipliers 161 and 162 to thereby quadrature-modulate the carrier having a frequency of (fc−fα) by the QPSK baseband digital signals I and Q output from the complex conjugator 14. Output signals from the quadrature modulators 13 and 16 are added by an adder 17. An output signal from the adder 17, i.e., a digital modulated signal and an AM modulated signal output from the AM modulator are added by an adder 18. An addition signal from the adder 18 is supplied to a D/A converter 20 to convert it into an analog signal which is output as an AM data multiplex modulated signal.

Figure 2:
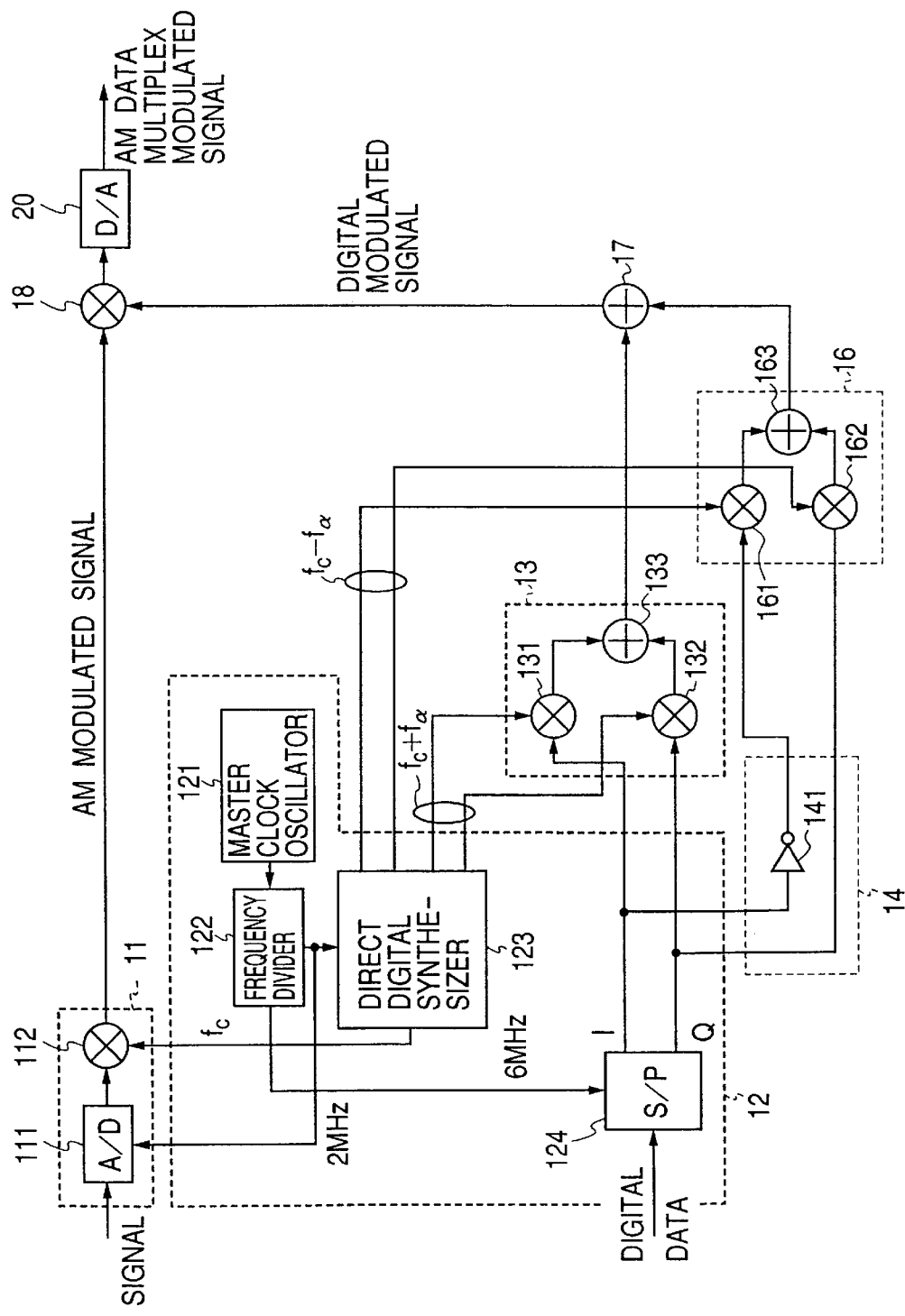
FIG. 2 is a block diagram showing the structure of an AM data multiplex modulated signal generating apparatus used for explaining the clock regeneration circuit of the embodiment.
Figure 3:
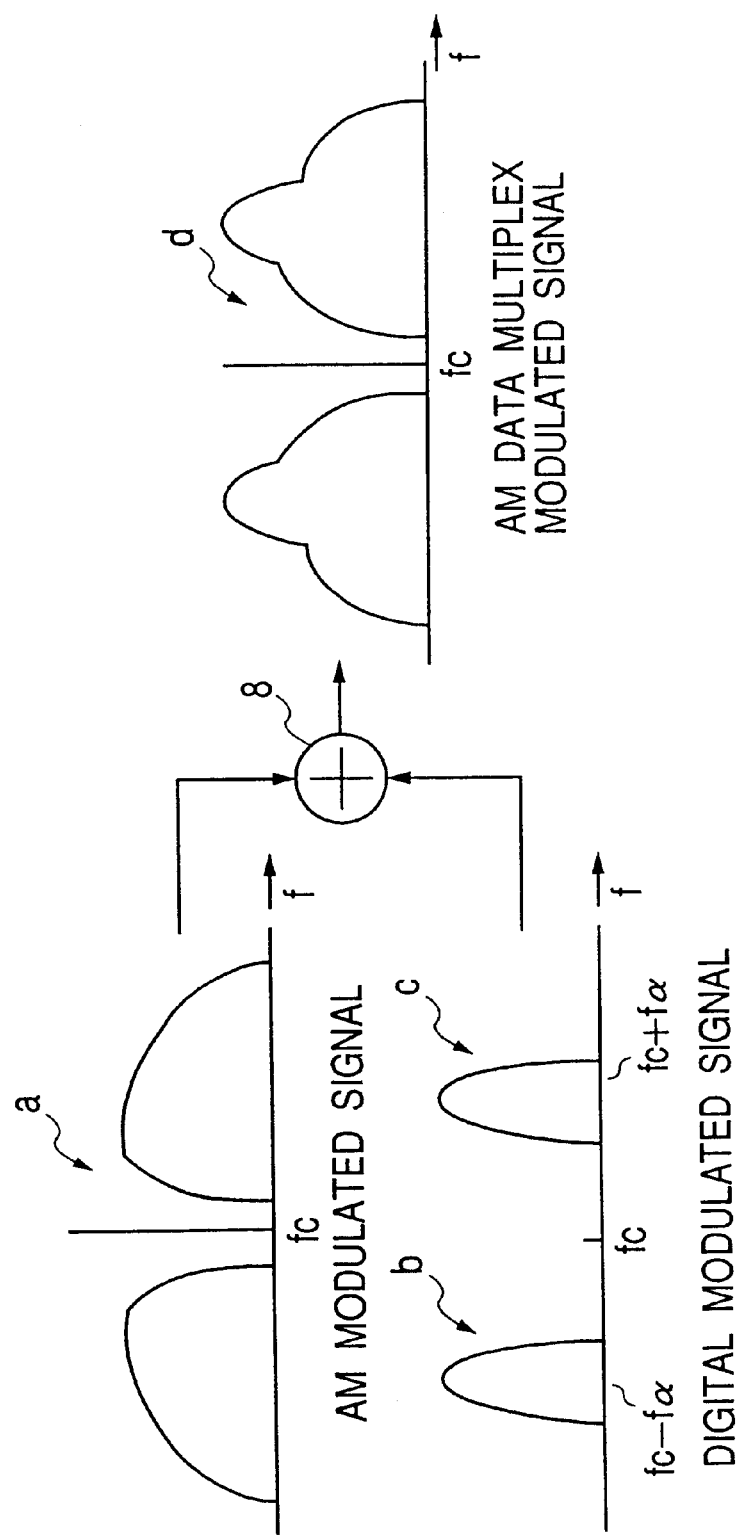
FIG. 3 is a schematic diagram illustrating the operation of the AM data multiplex modulated signal generating apparatus shown in FIG. 2.

An AM data multiplex modulation process by the AM data multiplex modulated signal generating apparatus shown in FIG. 2 and structured as above is schematically illustrated in FIG. 3. Referring to FIG. 3, an AM modulated signal output from the AM modulator 1 is indicated at a in FIG. 3. An output signal of the quadrature modulator 16, i.e., a digital modulated signal, is indicated at b in FIG. 3, and an output signal of the quadrature modulator 13, i.e., a digital modulated signal, is indicated at c in FIG. 3. A digital modulated signal output from the adder 17 is a sum of b and c shown in FIG. 3, and the AM data multiplex modulated signal output from the adder 18 is indicated at d in FIG. 3.

An AM data multiplex modulation process by the AM data multiplex modulated signal generating apparatus shown in FIG. 2 will be described.

An AM modulated signal vAM(t) is expressed by the following equation (1):

$$vAM(t)=\{I+\kappa vm(t)\} \cos \omega ct \qquad (1)$$

where I is an amplitude of the carrier, ωc (rad/s) is an angular frequency of the carrier, κ is a modulation factor, and vm(t) is an input signal.

The I and Q signal trains generated by the QPSK baseband digital signal generator 12 are represented by In and Qn which are also called dibits, where $$In = \pm 1$$

$$Qn = \pm 1.$$

The output signals from the QPSK baseband digital signal generator 12 are branched, one being supplied to the quadrature modulator 13 to which the carrier having the frequency (fc+fα) is supplied, whereat the carrier having an angular velocity of (ωc+ωα) (rad/s) is quadrature-modulated by the complex signal train. An output signal vDH(t) of the quadrature modulator 13 is expressed by the following equation (2):

$$vDH(t)=In \cos(\omega c+\omega\alpha)t+Qn \sin(\omega c+\omega\alpha)t \qquad (2).$$

The other output signal from the QPSK baseband digital signal generator 12 is supplied to the quadrature modulator 14 in which the signs of the output signals In and Qn are converted into (−In) and (Qn). This complex signal train is supplied to the quadrature modulator 16 to which the carrier having the frequency (fc−fα) is supplied, whereat the carrier having an angular velocity of (ωc−ωα) (rad/s) is quadrature-modulated by the complex signal train. An output signal vDL(t) of the quadrature modulator 16 is expressed by the following equation (3):

$$vDL(t) = -In \cos(\omega c - \omega \alpha)t + Qn \sin(\omega c - \omega \alpha)t \quad (3).$$

The output signals vDH(t) and vDL(t) given by the equations (2) and (3) are added by the adder 17, and the addition signal or digital modulated signal vD(t) is given by the following equation (4):

$$\begin{aligned} vD(t) &= vDH(t) + vDL(t) \quad (4)\\ &= In \cos(\omega c + \omega \alpha)t + Qn \sin(\omega c + \omega \alpha)t \\ &= In \cos(\omega c - \omega \alpha)t + Qn \sin(\omega c - \omega \alpha)t. \end{aligned}$$

The AM modulated signal vAM(t) and digital modulated signal vD(t) are added by the adder 18, and the AM data multiplex modulated signal v(t) is expressed by the following equation (5) by using the equations (1) and (4):

$$\begin{aligned} v(t) &= vAM(t) + vD(t) \quad (5)\\ &= \{1 + \kappa vm(t)\} \cos \omega ct + \\ &\quad In \cos(\omega c + \omega \alpha)t + Qn \sin(\omega c + \omega \alpha)t - \\ &\quad In \cos(\omega c - \omega \alpha)t + Qn \sin(\omega c - \omega \alpha)t \end{aligned}$$

Next, AM-synchronous detection for the AM data multiplex modulated signal generated in the above manner will be described.

For synchronous detection, the equation (5) is multiplied by the carrier cos ωct to obtain the following equation:

$$\begin{aligned} 2\{v(t) \cos \omega ct\} &= \{1 + \kappa vm(t)\} + In \cos \omega \alpha t + Qn \sin \omega \alpha t - \\ &\quad In \cos(-\omega \alpha)t + Qn \sin(-\omega \alpha)t + \\ &\quad \{1 + \kappa vm(t)\} \cos 2\omega ct + In \cos(2\omega c + \omega \alpha)t + \\ &\quad Qn \sin(2\omega c + \omega \alpha)t - In \cos(2\omega c - \omega \alpha)t + \\ &\quad Qn \sin(2\omega c - \omega \alpha)t \end{aligned}$$

The AM synchronous detector has a low-pass filter so that high frequency components are removed. Therefore, the above equation is changed to the following equation (6):

$$\begin{aligned} 2\{v(t) \cos \omega ct\} &= \{1 + \kappa vm(t)\} + In \cos \omega \alpha t + Qn \sin \omega \alpha t - \quad (6)\\ &\quad In \cos(-\omega \alpha)t + Qn \sin(-\omega \alpha)t \\ &= \{1 + \kappa vm(t)\} + In \cos \omega \alpha t + Qn \sin \omega \alpha t - \\ &\quad In \cos \omega \alpha t - Qn \sin \omega \alpha t \\ &= 1 + \kappa vm(t). \end{aligned}$$

As seen from the equation (6), the digital modulated signal components are canceled out. Therefore, if the d.c. component of the equation (6) is cut and the left signal is amplified, the original signal vm(t) before it is modulated by the AM data multiplex modulated signal generating apparatus of the embodiment can be picked up. It can, therefore, be understood that an AM-synchronous detection signal obtained by AM-synchronous detecting the AM data multiplex modulated signal modulated by the AM multiplex modulated signal generator shown in FIG. 2 is not adversely affected.

The QPSK baseband digital signal generator 12 shown in FIG. 2 may use other modulation methods, such as PSK, ASK, QAM, FSK, MSK, or the like. Although the embodiment uses two digital modulation carriers at frequencies (fc+fα) and (fc−fα), two or more digital modulation carriers may also be used, such as multi-carriers, frequency hopping, OFDM, or the like.

The AM data multiplex modulated signal modulated in the above manner is obtained by multiplexing the digital modulated signal and the AM modulated signal in the same frequency band and at the same time. Therefore, as different from those modulation methods of time division multiplex and frequency multiplex, the clock signal cannot be reproduced by extracting a desired digital modulated signal at a selected data multiplex time and frequency band.

As shown in FIG. 1, in the clock regeneration circuit according to the embodiment of the invention, an AM data multiplex modulated signal is supplied to a band-pass filter 1 having a narrower band than the band width of the AM data multiplex modulated signal to extract the carrier of the AM modulated signal. The extracted carrier is supplied to a limiter 2 to remove AM modulated components which are not removed by the band-pass filter 1. An output of the limiter 2 is supplied to a phase comparator 3.

An output of the phase comparator 3 is supplied to a loop filter 4 composed of a low-pass filter to smooth it which is then supplied to a voltage-controlled oscillator 5 as a frequency control voltage. A free-running oscillation frequency of an oscillation output of the voltage-controlled oscillator 5 is set to 32 MHz. An oscillation output of the voltage-controlled oscillator 5 is output as a regenerated clock signal and also supplied to a direct digital synthesizer 6.

In the direct digital synthesizer 6, the oscillation output of the voltage-controlled oscillator 5 is frequency-divided into a signal having a frequency of 2 MHz, a frequency-divided signal output from the frequency divider 61 being supplied to a counter 62. Waveform data is read from a waveform ROM 63 which stores waveforms, by using a count of the counter as an address. The waveform data read from the waveform ROM is supplied to a D/A converter 64 in which it is converted into an analog signal. This analog signal is supplied to a low-pass filter 7 to remove aliasing components, and thereafter supplied to the phase comparator 3. The D/A converter 64 is supplied with an output from the frequency divider 61 as its conversion clock signal.

In this embodiment, even if the oscillation frequency of 32 MHz of the voltage-controller oscillator 5 is not an integer multiple (division ratio of the frequency divider 61) of an input frequency (reception frequency, such as 954 kHz, 1242 kHz, or the like, or an intermediate frequency) and has a fraction of the integer multiple, a regenerated clock signal can be obtained which has a predetermined regeneration clock frequency. It is, therefore, possible to obtain a regenerated clock signal having a predetermined regenerated clock frequency, by using the direct digital synthesizer having the waveform data ROM 63. It is necessary to set the input frequency in advance. Therefore, the waveform data ROM 63 stores sine wave data having input frequencies. In accordance with the input frequency, waveform data corresponding to the count of the counter 62 is read from the waveform data ROM 63 and converted into analog data which is input to the phase comparator. Namely, the direct digital synthesizer is used in order to obtain a predetermined regeneration clock by storing in advance waveform data corresponding to input frequencies.

In the clock reproduction circuit constructed as above according to the embodiment of the invention, the band-pass filter 1 extracts the carrier of the AM modulated signal from the AM data multiplex modulated signal, AM modulated components of the extracted carrier which are not removed by the band-pass filter 1 are removed by the limiter 2, and the carrier is supplied to the phase comparator 3 as a reference signal.

An output of the phase comparator 3 is smoothed by the loop filter 4, and the oscillation frequency of the voltage-controlled oscillator 5 is controlled in accordance with an output of the loop filter 4. The free-running oscillation frequency of an oscillation output of the voltage-controlled oscillator 5 is set to 32 MHz. An oscillation output of the voltage-controlled oscillator 5 is frequency-divided by the direct digital synthesizer 6, the frequency-divided signal is counted, and waveform data is read from the waveform data ROM 63 in accordance with a count value of the counter 62. The waveform data is converted into an analog signal by the D/A converter 64, and supplied via the low-pass filter 7 to the phase comparator 3 in which it is compared with the carrier of the AM modulated signal.

If the frequency of an output signal from the D/A converter 64 is different from the carrier frequency of the AM modulated signal, a beat corresponding to the frequency difference is superposed upon an output of the loop filter 4 so that the oscillation frequency of the voltage-controlled oscillator 5 changes. Accordingly, the carrier frequency of the AM modulated signal and the output signal of the low-pass filter 7 via the D/A converter 64 are synchronized with the carrier of the AM modulated signal.

An oscillation output from the voltage-controlled oscillator 5 therefore, becomes, a clock signal synchronized with the carrier of the AM modulated signal, and the oscillation output from the voltage-controlled oscillator 5 can be used as a clock signal for demodulating a digital modulated signal separated from the AM data multiplex modulated signal.

In the clock regeneration circuit according to the embodiment of the invention described above, the direct digital synthesizer 6 is used by way of example. Instead of the direct digital synthesizer 6, other frequency dividers may also be used. Also, in the clock regeneration circuit according to the embodiment of the invention described above, although QPSK is used as a digital modulation method, other modulation methods such as PSK, ASK, QAM, FSK and MSK may also be used, with similar advantages being expected.

Second Embodiment

Figure 4:
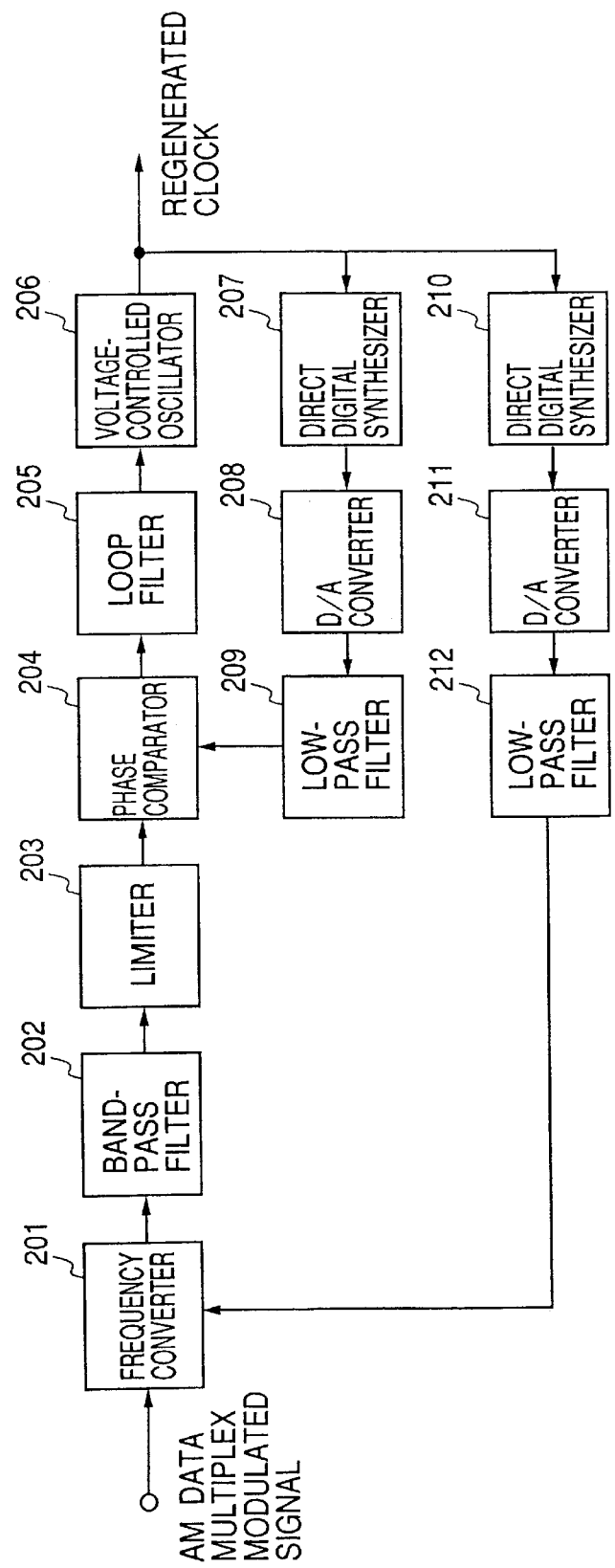
FIG. 4 is a block diagram showing the structure of a clock regeneration circuit according to another embodiment of the invention.

A clock regeneration circuit according to another embodiment of the invention is shown in FIG. 4. Referring to FIG. 4, an AM data multiplex modulated signal is supplied to a frequency converter 201 to be converted into an intermediate frequency. The AM data multiplex modulated signal converted into the intermediate frequency is band-limited by a band-pass filter 202 having a narrower band than the band width of the AM data multiplex modulated signal. The band-pass filter 202 extracts the carrier of the AM modulated signal from the AM data multiplex modulated signal.

The carrier extracted by the band-pass filter 202 is further supplied to a limiter 203 in which AM modulated components which are not removed by the band-pass filter 202 are removed. An output of the limiter 203 is supplied to a phase comparator 204. An output of the phase comparator 204 is supplied to a loop filter 205 composed of a low-pass filter to smooth the output of the phase comparator which is supplied to a voltage-controlled oscillator 206 as a frequency control signal. An oscillation output of the voltage-controlled oscillator 206 is output as a regenerated clock signal and also supplied to a direct digital synthesizer 207.

The direct digital synthesizer 207 outputs waveform data having a frequency equal to the frequency-converted carrier frequency, for example, in accordance with an oscillation output of the voltage-controlled oscillator 206. The waveform data output from the direct digital synthesizer 207 is supplied to a D/A converter 208 to be converted into an analog signal. The frequency of the converted analog signal is equal to the frequency-converted carrier frequency, and after aliasing components of the analog signal are removed at a low-pass filter 209, the signal is supplied to the phase comparator 204. In accordance with an output from the phase comparator 204, the oscillation frequency of the voltage-controlled oscillator 206 is controlled.

An oscillation output from the voltage-controlled oscillator 206 is also supplied to another direct digital synthesizer 210 which outputs waveform data having a frequency equal to the local oscillation frequency. The waveform data output from the direct digital synthesizer 210 is supplied to a D/A converter 211 to be converted into an analog signal. The frequency of the converted analog signal is equal to the local oscillation frequency, and after aliasing components of the analog signal are removed at a low-pass filter 212, the signal is supplied to the frequency converter 201 as a local oscillation output to thereby convert the AM data multiplex modulated signal into an intermediate frequency.

In the clock regeneration circuit constructed as above according to the second embodiment of the invention, the AM data multiplex modulated signal is converted into the intermediate frequency, the band-pass filter 202 extracts the carrier of the AM modulated signal from the AM data multiplex modulated signal converted into the intermediate frequency, AM modulated components of the extracted carrier which are not removed by the band-pass filter 202 are removed by the limiter 203, and the carrier is supplied to the phase comparator 204 as a reference signal.

An output of the phase comparator 204 is smoothed by the loop filter 205, and the oscillation frequency of the voltage-controlled oscillator 206 is controlled in accordance with an output of the loop filter 205. An oscillation output of the voltage-controlled oscillator 205 is supplied to the direct digital synthesizer 207 which outputs the waveform data having a frequency equal to the frequency-converted carrier frequency. The waveform data is converted into an analog signal by the D/A converter 208, and after aliasing noises are removed by the low-pass filter 209, the phase of the analog signal is compared by the phase comparator 204 with the carrier of the frequency-converted AM modulated signal output from the limiter 203.

If the frequency of an output signal from the D/A converter 208 is different from the carrier frequency of the frequency-converted AM modulated signal, a beat corresponding to the frequency difference is superposed upon an output of the loop filter 205 so that the oscillation frequency of the voltage-controlled oscillator 206 is changed. Accordingly, the frequencies of the waveform data output from the direct digital synthesizers 207 and 210 are changed so that the frequencies of the output signals from the D/A converters 208 and 211 are changed. Therefore, the output signal via the low-pass filter 209 from the D/A converter 208 converges to the carrier frequency of the frequency-converted AM modulated signal, and then the output signal via the low-pass filter 212 from the D/A converter 211 converges to the local oscillation frequency used for frequency conversion. Accordingly, the oscillation frequency of the voltage-controlled oscillator 206 is synchronized with the carrier of the frequency-converted AM modulated signal.

An oscillation output from the voltage-controlled oscillator 206 therefore, becomes, a clock signal synchronized with the carrier of the AM modulated signal, and the oscillation output from the voltage-controlled oscillator 206 can be used as a clock signal for demodulating a digital modulated signal separated from the AM data multiplex modulated signal.

As described so far, according to the clock regeneration circuit of the invention, it is possible to regenerate a clock signal for data demodulation from an AM data multiplex modulated signal obtained by multiplexing a digital modulated signal and an AM modulated signal in the same frequency band and at the same time.

What is claimed is:

1. A clock regeneration circuit for regenerating a clock signal for data demodulation of a digital modulated signal from an AM data multiplex modulated signal obtained by multiplexing the digital modulated signal and an AM modulated signal in the same frequency band and at the same time, the clock regeneration circuit comprising, carrier extracting means for extracting a carrier of the AM modulated signal from the AM data multiplex modulated signal, phase comparator means for receiving as one input the carrier extracted by said carrier extracting means, a voltage-controlled oscillator whose oscillation frequency is controlled by an output from said phase comparator means, and frequency-dividing means for frequency-dividing the oscillation frequency of said voltage-controlled oscillator and supplying a frequency-divided output to said phase comparator means as another input, wherein the oscillation output of said voltage-controlled oscillator is a clock signal synchronized with the carrier of the AM data multiplex modulated signal.

2. A clock regeneration circuit according to claim 1, wherein said frequency-dividing means includes a direct digital synthesizer.

3. A clock regeneration circuit according to claim 2, wherein said direct digital synthesizer includes a counter and a waveform ROM.

4. A clock regeneration circuit according to claim 1 further comprising a loop filter for smoothing an output of said phase comparator means and applying the smoothed output to said voltage-controlled oscillator.

5. A clock regeneration circuit for regenerating a clock signal for data demodulation from an AM data multiplex modulated signal obtained by multiplexing a digital modulated signal and an AM modulated signal in the same frequency band and at the same time, the clock regeneration circuit comprising, frequency-converting means for frequency-converting the AM data multiplex modulated signal into an intermediate frequency, carrier extracting means for extracting a carrier of the AM modulated signal from the AM data multiplex modulated signal frequency-converted into the intermediate frequency, phase comparator means for receiving as one input the carrier extracted by said carrier extracting means, a voltage-controlled oscillator whose oscillation frequency is controlled by an output from said phase comparator means, a first direct digital synthesizer for inputting an oscillation output from said voltage-controlled oscillator and supplying an output to said phase comparator means as another input, and a second direct digital synthesizer for inputting the oscillation output from said voltage-controlled oscillator and supplying an output to said frequency-converting means as a local oscillation output, wherein the oscillation output of said voltage-controlled oscillator which is a clock signal synchronized with the carrier of the AM data multiplex modulated signal is used as a clock signal for data demodulation from the AM data multiplex modulated signal.

* * * * *